United States Patent
Shoki et al.

(10) Patent No.: US 6,737,201 B2
(45) Date of Patent: May 18, 2004

(54) SUBSTRATE WITH MULTILAYER FILM, REFLECTION TYPE MASK BLANK FOR EXPOSURE, REFLECTION TYPE MASK FOR EXPOSURE AND PRODUCTION METHOD THEREOF AS WELL AS PRODUCTION METHOD OF SEMICONDUCTOR DEVICE

(75) Inventors: Tsutomu Shoki, Tama (JP); Morio Hosoya, Musashino (JP)

(73) Assignee: Hoya Corporation, Tokyo (JP)

( * ) Notice: Subject to any disclaimer, the term of this patent is extended or adjusted under 35 U.S.C. 154(b) by 150 days.

(21) Appl. No.: 09/987,990

(22) Filed: Nov. 16, 2001

(65) Prior Publication Data

US 2002/0076625 A1 Jun. 20, 2002

(30) Foreign Application Priority Data

Nov. 22, 2000 (JP) ........................................ 2000-356292

(51) Int. Cl.$^7$ ................................................ G03F 9/00
(52) U.S. Cl. .......................................................... 430/5
(58) Field of Search ............................. 430/5; 428/428, 428/433; 378/34, 35

(56) References Cited

U.S. PATENT DOCUMENTS 6,352,803 B1 * 3/2002 Tong et al. ..................... 430/5

FOREIGN PATENT DOCUMENTS

| JP | 7-27198 | 3/1995 | ............. G03F/1/08 |
| JP | 8-213303 | 8/1996 | ......... H01L/21/027 |

* cited by examiner

Primary Examiner—S. Rosasco
(74) Attorney, Agent, or Firm—Sughrue Mion, PLLC (57) ABSTRACT

In a reflection type mask blank for EUV exposure with a substrate, a multilayer film is formed on the substrate so as to reflect an EUV light ray. A light absorber layer is formed on the multilayer film so as to absorb the EUV light ray. The multilayer film has flatness with respect to a surface thereof, and the flatness is 100 nm or less.

15 Claims, 4 Drawing Sheets

SUBSTRATE WITH MULTILAYER FILM, REFLECTION TYPE MASK BLANK FOR EXPOSURE, REFLECTION TYPE MASK FOR EXPOSURE AND PRODUCTION METHOD THEREOF AS WELL AS PRODUCTION METHOD OF SEMICONDUCTOR DEVICE

BACKGROUND OF THE INVENTION

This invention broadly relates to a substrate with a multilayer film, a reflection type mask blank, and a reflection type mask for use in a semiconductor production to control a light ray, and a production method thereof as well as a method for manufacturing a semiconductor device.

Herein, it should be noted that an EUV (Extreme Ultra Violet) light ray, which will be described later, represents a light ray with wavelength band of a soft X-ray region or a vacuum ultraviolet region, more specifically a light ray with wavelength of about 0.2–100 nm.

Conventionally, use has been made of a photolithography method using a visible light ray or an ultraviolet light ray as a transfer technique of a fine pattern required for forming an integrated circuit with fine patterns on a Si substrate or the like in a semiconductor industry.

However, a semiconductor device has been rapidly reduced in size in recent years. Consequently, shortening wavelength has been largely restricted because of an exposure limit in conventional optical exposure.

Under such a circumstance, a resolution limit of a pattern will be a half of exposure wavelength in case of the optical exposure. It is predicted that the resolution limit is equal to approximately 70 nm even if an $F_2$ laser ray (157 nm) is used.

Therefore, a great attention has been paid for an EUV lithography (hereinafter, it will be abbreviated as "EUVL") as an exposure technique, in which an EUV light ray (13 nm) having wavelength shorter than the $F_2$ laser ray is used, as a next generation exposure technique with 70 nm or shorter.

In general, an image forming principle of EUVL is the same as the photolithography. However, absorption rate for all substances with respect to the EUV light ray is high, and further, index of refraction is substantially equal to 1.

In consequence, a refraction optical system can not be used different from the optical exposure, and alternatively, a reflection optical system must be used.

In this event, suggestion has been made about a transmission type mask using a membrane as a mask used in the above-mentioned case. However, the absorption rate of the membrane for the EUV light ray becomes high. Thereby, exposure duration becomes long, and a desired throughput can not be maintained. For this reason, the reflection type mask for exposure is generally used in the recent years.

For example, a reflection type mask for exposure is disclosed in Japanese Examined patent publication No. 7-27198 and Japanese Unexamined Patent Publication No. 8-213303. In such a reflection type mask, a reflection layer with a multilayer structure is formed on a substrate and an absorber for absorbing a soft X-ray or a vacuum ultraviolet ray is formed to a pattern shape on the reflection layer.

Figure 1A:
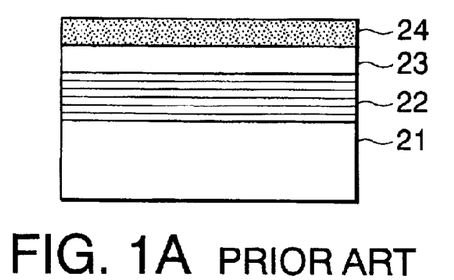
FIGS. 1A and 1B are general diagrams (cross sectional views) of an EUV mask blank and an EUV mask according to the conventional embodiment.
Figure 1B:
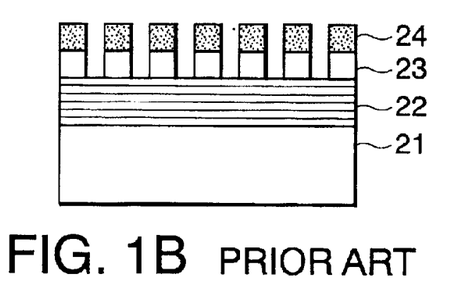

FIGS. 1A and 1B are schematic views showing an example of the conventional reflection type mask blank for exposure and the conventional reflection type mask for exposure.

As illustrated in FIG. 1A, a reflection film 22 with a multilayer structure is deposited on a substrate 21, an etching stopper layer 23 is deposited on the reflection film 22, and an absorber layer 24 is deposited on the etching stopper layer 23.

With such a structure, a pattern is formed for the absorber layer 24 of the reflection type mask blank for exposure, and an unnecessary etching stopper layer 23 on the multilayer film is removed, thus manufacturing the reflection type mask for exposure illustrated in FIG. 1B.

Under this circumstance, the soft X-rays entered to the reflection type mask for exposure is reflected by the reflection film 22, and is absorbed at a portion, in which the pattern of the absorber 24 is formed, without reflection. As a result, the pattern can be formed with high contrast between a reflection portion and an absorption portion.

However, it is necessary to increase film density of each layer of the multilayer film 22 to obtain high index of reflection in the reflection type mask for exposure in which the multilayer film 22 is deposited on the above-mentioned substrate 21. Consequently, the multilayer film 22 inevitably has high compression stress.

Figure 2:
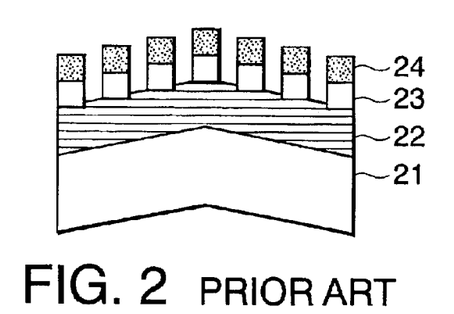
FIG. 2 is a general diagram (cross sectional view) of an EUV mask according to the conventional embodiment.

In the cause of such high compression stress, the substrate 21 is largely warped or deformed through a convex surface, as illustrated in FIG. 2. As a result, warping also occurs for the surface of the multilayer film 22 serving as a reflection surface of the EUV light ray.

For example, when the compression stress of about 200 MPa is applied for the multilayer film 22 with a 0.3 μm thickness on a quartz substrate having a 6 inch square and a 6.35 mm thickness, warping (deformation) on the order of 500 nm inevitably takes place for an area of 140×140 mm.

As discussed above, transfer accuracy is lowered or image placement error occurs in the cause of the warping of the surface of the multilayer film 22 during transferring a pattern onto a wafer according to the conventional technique. Thereby, transfer can not be carried out with high accuracy. To solve such a problem, the stress of the multilayer film 22 may be reduced. However, this method is not preferable from a practical viewpoint because the film density and the reflectivity of the EUV light ray are lowered.

Further, the warping of the multilayer film 22 is affected by the warping inherent to the substrate 21 in addition to the deformation of the substrate 21 due to the compression stress of the above-mentioned multilayer film 22.

Accordingly, it is difficult to effectively correct the warping of the surface of the multilayer film 22 by merely reducing the stress of the multilayer film 22.

SUMMARY OF THE INVENTION

This invention is made under the above-discussed background. It is therefore an object of this invention to provide a substrate with a multilayer film, a reflection type mask blank for exposure, and a reflection type mask for exposure which has a surface of a multilayer film with high flatness by correcting warping (deformation) of the surface of the multilayer film formed by stress of the multilayer film and the warping (deformation) of the substrate itself.

According to a first aspect of this invention, a reflection type mask blank for EUV exposure has a substrate.

Further, a multilayer film is formed on the substrate so as to reflect an EUV light ray. An absorber layer is formed on the multilayer film so as to absorb the EUV light ray. Under this circumstance, the multilayer film has flatness with respect to a surface thereof, and the flatness is 100 nm or less.

Herein, the flatness described in the instance specification indicates the warping (deformation quantity) of the surface represented by TIR (Total Indicated Reading), and will be defined as follows.

Figure 3:
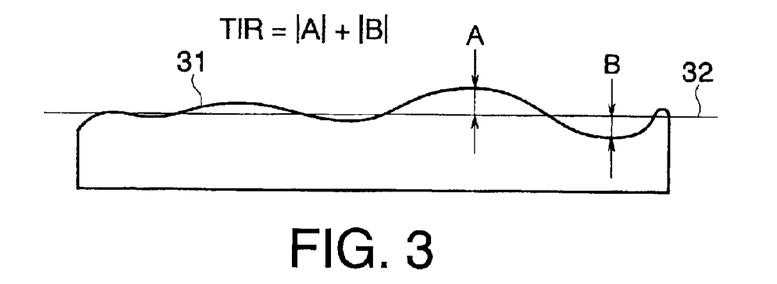
FIG. 3 is a general diagram explaining definition of flatness according to this invention.

Namely, a plane surface defined by a least square method based upon a substrate surface 31 is defined as a focal plane in FIG. 3. Subsequently, an absolute value of a difference between a highest position A of the substrate surface 31 over the focal plane 32 based upon the focal plane 32 and a lowest position B of the substrate surface 31 under the focal plane 32 is defined as the flatness. Therefore, the flatness is always a positive number.

In this event, a measured value within a area of 140×140 mm is defined as the flatness according to this invention. For example, it is a measured value within the area of 140 ×140 mm with respect to a center of a 6 inch substrate.

According to a second aspect of this invention, a reflection type mask blank for EUV exposure has a substrate.

Further, a multilayer film is formed on the substrate so as to reflect an EUV light ray. A light absorber layer is formed on the multilayer film so as to absorb the EUV light ray. A stress correction film corrects warping of a surface of the multilayer film. In this event, the warping is formed by warping of the substrate and stress of the multilayer film.

According to a third aspect of this invention, the stress correction film has tensile stress, and is placed between the substrate and the multilayer film in the mask blank of the second aspect of this invention.

According to a fourth aspect of this invention, the stress correction film has compressive stress, and is placed on a back surface of the substrate in the mask blank of the second aspect of this invention.

According to a fifth aspect of this invention, the stress correction film is made of material containing Ta in the mask blank as claimed in any one of the second through fourth aspects of this invention.

According to a sixth aspect of this invention, the stress correction film is made of material containing Ta as a major component and at least B in the mask blank of the fifth aspect of this invention.

According to a seventh aspect of this invention, a reflection type mask for EUV exposure is produced by using the reflection type mask for EUV exposure blank of any one of the first through sixth aspects of this invention.

According to an eighth aspect of this invention, a reflection type mask for EUV exposure produced by using the reflection type mask for EUV exposure blank of any one of the first through sixth aspect of this invention is manufactured.

According to a ninth aspect of this invention, a semiconductor device is manufactured such that a pattern is transferred on the substrate by using the reflection type mask for EUV exposure of the seventh aspect of this invention.

According to a tenth aspect of this invention, a substrate has a multilayer film for reflecting an EUV light ray onto a substrate. Under such a condition, the multilayer film has flatness with respect to a surface thereof, and the flatness is 100 nm or less.

According to an eleventh aspect of this invention, a substrate has a multilayer film for reflecting an EUV light ray onto a substrate.

Further, a stress correction film corrects warping of a surface of the multilayer film. In this case, the warping is formed by warping of the substrate and stress of the multilayer film.

According to a twelfth aspect of this invention, an EUV reflection mirror is produced by using the substrate with the multilayer film of the tenth or eleventh aspect of this invention.

According to a thirteenth aspect of this invention, a reflection type mask blank for exposure has a substrate.

Further, a multilayer film is formed on the substrate so as to reflect a light ray. A light absorber layer is formed on the multilayer film so as to absorb the light ray.

Under this circumstance, the multilayer film has flatness with respect to a surface thereof, and the flatness is 100 nm or less.

According to a fourteenth aspect of this invention, a reflection type mask blank for exposure has a substrate.

Further, a multilayer film is formed on the substrate so as to reflect a light ray. A light absorber layer is formed on the multilayer film so as to absorb the light ray. A stress correction film corrects warping generated on a surface of the multilayer film when the stress correction film is not formed.

According to a fifteenth aspect of this invention, a reflection type mask for exposure is produced by using the reflection type mask blank for exposure of the thirteenth or fourteenth aspect of this invention.

DESCRIPTION OF PREFERRED EMBODIMENTS

Figure 4:
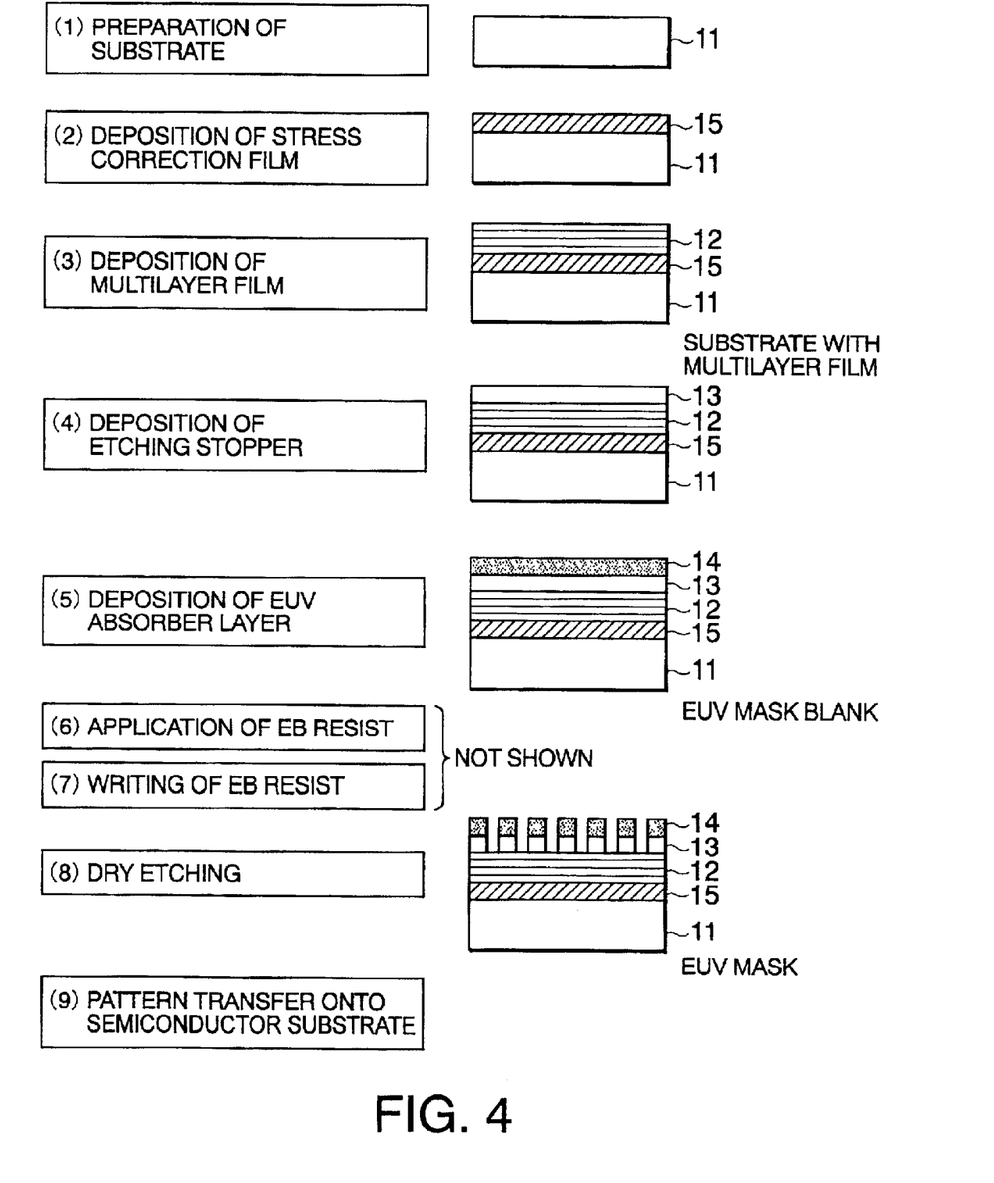
FIG. 4 is a production flow of a substrate with a multilayer film, an EUV mask blank, and an EUV mask according to a first embodiment of this invention.
Figure 5:
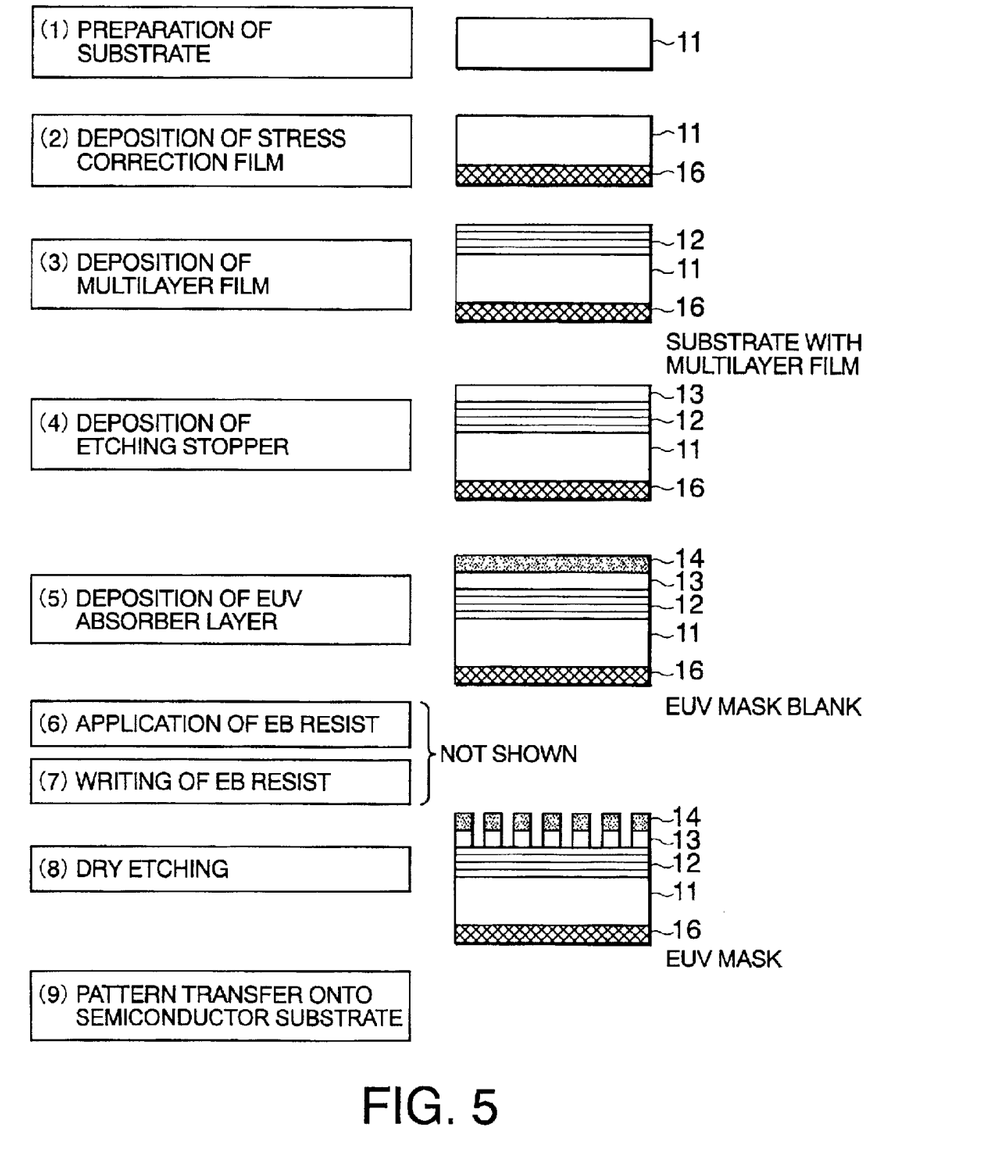
FIG. 5 is a production flow of a substrate with a multilayer film, an EUV mask blank, and an EUV mask according to a second embodiment of this invention.
Figure 6:
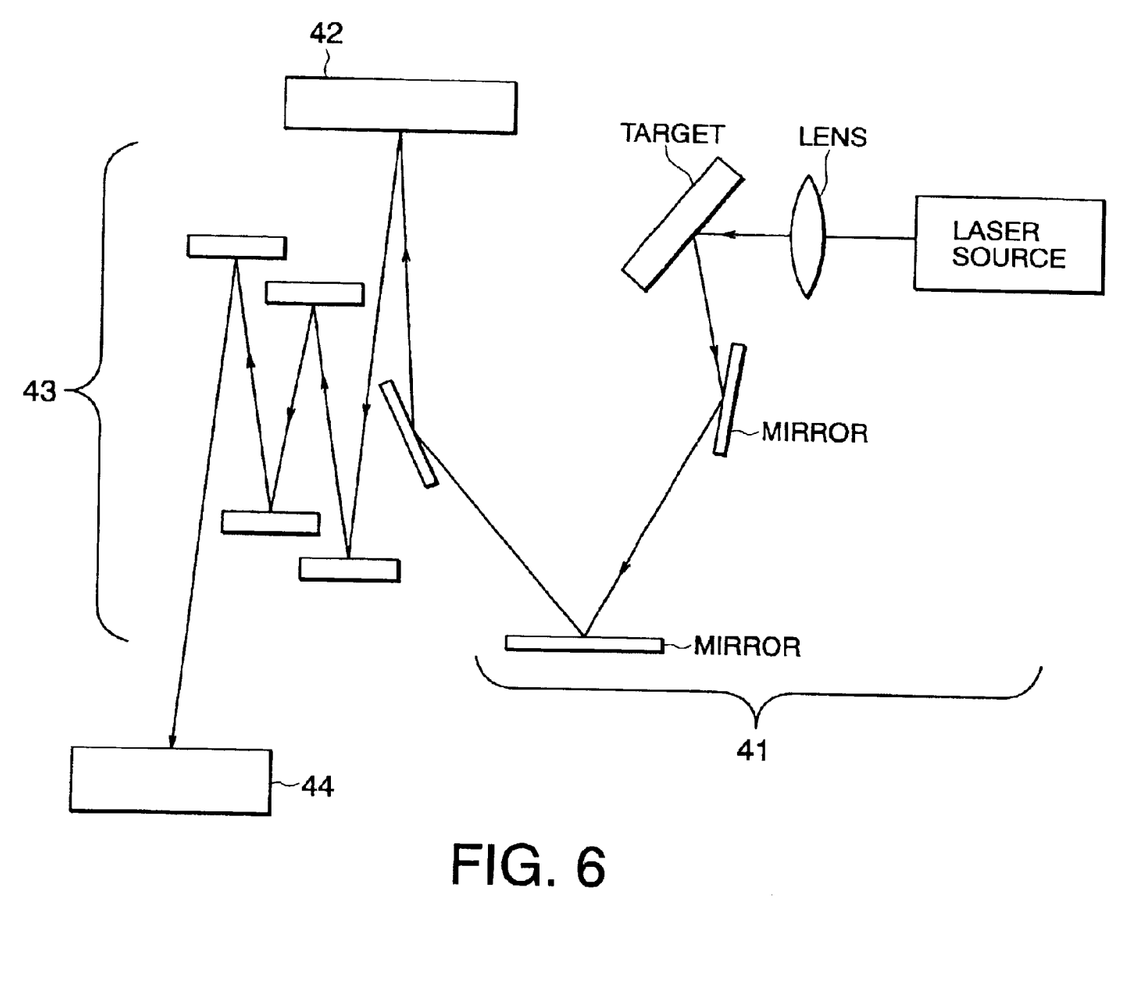
FIG. 6 is a general diagram showing pattern transfer due to EUV onto a Si substrate by using an EUV mask according to this invention.

FIGS. 4 and 5 are flow diagrams showing a general production method of an EUV reflection type mask for exposure, and FIG. 6 is a schematic diagram in which lithography transfer of a pattern is carried out, for example, onto a Si wafer substrate by the use of the produced EUV mask according to first and second embodiments.

Herein, it is to be noted that the reflection type mask for exposure will be hereinafter abbreviated as an EUV mask while the reflection mask for EUV exposure will be abbreviated as an EUV mask blank.

(First Embodiment)

Referring now to FIGS. 4 and 6, description will be made about a production of the EUV mask and pattern transfer onto a semiconductor substrate using the EUV mask according to a first embodiment of this invention.

The production of the EUV mask and the pattern transfer onto the semiconductor substrate due to the EUV mask comprises (1) a preparation step of a substrate, (2) a deposition step of a stress correction film onto the substrate, (3) a deposition step of the multilayer film onto the substrate, (4) a deposition step of the etching stopper, (5) a deposition step of an EUV absorber layer, (6) an EB resist application step, (7) an EB writing step, (8) a dry-etching step, and (9) a pattern transfer step onto the semiconductor substrate due to the EUV mask.

(1) Preparation step of the substrate:

It is preferable that the substrate 11 has low coefficient of thermal expansion and is superior in smoothness, flatness, and resistance to a cleaning method used for washing the EUV mask. A glass with low coefficient of thermal expansion such as a $SiO_2$—$TiO_2$ based glass is generally used as the substrate 11.

However, the substrate 11 is not restricted to such a glass, and a substrate such as a crystallized glass precipitated with ■ quartz solid solution, a quartz glass, silicon, and metal can be used. As an example of a metal substrate, Invar alloy (Fe—Ni based alloy) can be used.

It is desirable that the substrate 11 has a smooth surface of 0.2 nm Rms or less and flatness of 100 nm or less in order to realize high reflectivity and high transfer accuracy.

Meanwhile, unit Rms representing the smoothness is square average root roughness which can be measured by the use of an atomic force microscope (AMF).

Specifically, measurement is carried out, for example, within the range of 10 · m square. However, it is preferable to have the smoothness which is uniform within an effective area of a mask. Here, it is considered that the effective area of the mask means, for example, an area of about 140 mm square in the case of the mask for the EUV light exposure.

(2) Deposition step of the stress correction film onto the substrate:

Inventor's has studied enthusiastically in order to achieve the above-mentioned object of this invention, thus obtaining the following result.

Namely, the stress correction film 15 is deposited so as to correct the warping (deformation) of the substrate 11 formed by the stress of the multilayer film 12 under a such condition that will be described later. Thereby, the warping (deformation) of the substrate 11 will be corrected, and the surface of the multilayer film 12 can be kept flat even if the multilayer film 12 with high stress is deposited thereon.

Further preferably, Inventor's has found out the following fact. That is, even when the warping (deformation) of the substrate 11 itself is large, the warping of the surface of the multilayer film including the warping (deformation) of the substrate 11 itself can be corrected by suitably adjusting a stress value of the stress correction film 15.

Specifically, the warping (deformation) of the surface of the multilayer film is determined by the total of the warping (deformation) generated by the stress (normally, the compression stress) of the multilayer film 12 and the warping (containing the warping generated during manufacturing the substrate) of the substrate itself.

If this fact is correct, the stress correction film 15 will be deposited so as to correct the warping of the substrate itself and the warping of the surface of the multilayer film 12 formed by the stress of the multilayer film 12.

In this case, the stress correction film can be deposited between the substrate and the multilayer film or on a back surface (such a surface that the multilayer film is not deposited) of the substrate.

Thus, the image placement error, which will occur during transferring the pattern onto the wafer, can be suppressed so as to enhance the accuracy by correcting the warping of the surface of the multilayer film and by increasing the flatness, for example, in the EUV mask of this invention.

More specifically, in case that the flatness of the multilayer film is set to 100 nm, the image placement error is equal to about 2.2 nm while in the case of 50 nm, it can be suppressed to about 1.1 nm, thereby being capable of transferring the pattern with high accuracy.

The stress of the multilayer film can be calculated by measuring the warping of the substrate before and after the deposition of the multilayer film and determining difference of the warping before and after the deposition. Herein, it should be noted that the compression stress becomes minus sign and the tensile stress becomes plus sign.

Further, the stress of the multilayer film can be predicted from material thereof and deposition condition with certain degree. In consequence, the stress of the multilayer film is predicted from data which are obtained experimentally, so that the stress and film thickness given to the stress correction film can be determined also. In addition, the stress and film thickness given to the stress correction film may be suitably corrected by monitoring as needed.

Meanwhile, the stress correction film is deposited between the substrate and the multilayer film in a first embodiment. While the stress correction film will be deposited on the back surface of the substrate in a second embodiment, as will be described later.

In the case where the substrate without the warping (deformation) can be used as the substrate 11, the stress correction film 15 will be deposited with such stress and film thickness that the stress of the multilayer film can be cancel.

In this event, the material, the deposition condition and the thickness will be determined such that stress thickness per unit thickness of the film to be deposited is balanced to each other because the stress is generally represented by a value per unit thickness.

According to the first embodiment, the stress correction film 15 is deposited between the substrate 11 and the multilayer film 12. Consequently, the stress correction film 15, which has the same force and the opposite direction for the stress of the multilayer film 12, will be deposited.

In the meantime, the substrate given the warping in advance is used often. In this case, the direction of the warping of the substrate 11 is the same as the direction of the multilayer film 12 in a case (A). On the other hand, the direction of the warping of the substrate 11 is opposite to the direction of the multilayer film 12 in a case (B).

(A) In the case where the direction of the warping of the substrate 11 is the same as the direction of the multilayer film 12:

In this event, the total of the warping (deformation) of the substrate 11 and the stress of the multilayer film 12 causes the warping of the surface of the multilayer film 12. Accordingly, the stress correction film 15 will be deposited so as to cancel the total of such stress.

(B) In the case where the direction of the warping of the substrate 11 is opposite to the direction of the multilayer film 12:

The stress of the multilayer film 12 can be reduced and canceled by the warping (deformation) of the substrate 11 given in advance.

The multilayer film 12 generally has the compression stress. Consequently, the warping occurs for the substrate 11 deposited with the multilayer film 12 such that the deposited side becomes convex.

Therefore, if the multilayer film 12 is deposited on the substrate 11 which is given the warping such that the side deposited with the multilayer film 12 becomes hollow in advance, the warping of the substrate 11 and the warping due to the stress of the multilayer film 12 are canceled to each other, thus reducing the warping of the surface of the multilayer film. Under this circumstance, the stress correction film 15 is deposited against the reduced warping to thereby cancel the warping.

Meanwhile, if the stress of the multilayer film can be completely cancelled by the warping (deformation) of the substrate 11 given in advance, a flat surface of the multilayer film can be obtained without depositing the stress correction film 15.

In order to adjust the substrate 11 given the warping in advance, for example, the substrate 11 will be processed so as to form a desired surface (warping) when the substrate is initially sliced.

Here, description will be made about a method for depositing the stress correction film 15.

Amorphous material is preferable because the surface of the stress correction film must be a smooth film. Further, material containing Ta as a major component is desirable also. Particularly, amorphous material containing Ta as a major component is preferable. A smoothness of the stress correction film is preferably 0.2 nmRms, more preferably, 0.15 nmRms.

Moreover, a material containing Cr is usable as the material of the stress correction film. The material containing Cr is superior in smoothness, resistance to cleaning method, and controllability of the stress.

For example, a material containing Cr and N can be used as the material containing Cr. In case where CrN is employed, the ratio of N will fall within the range between 5 and 35 at %, more preferably, within the range between 10 and 25 at %.

Here, the material containing Cr and N may additionally contain O or C. Alternatively, the material can contain both O and C. In this event, the material containing Cr can be produced by the use of the known DC sputtering method.

When a TaB film (containing Ta and B) is used as the stress correction film 15, it is preferable that the deposition is carried out at the room temperature under Ar gas atmosphere by the use of a DC magnetron sputtering method. Under this circumstance, the stress of the stress correction film 15 can be adjusted to a desired value by suitably controlling a deposition method or a deposition condition (sputter gas pressure, introducing power, film thickness or the like).

For example, if the sputter gas pressure is varied under constant introducing power in the case of the TaB film, the compression stress appears at a low pressure side. When gas pressure is increased, the stress is reduced so as to finally become zero. When the gas pressure is further increased, the tensile stress appears, and the stress is increased with the gas pressure. Thus, stress variation occurs in accordance with the sputter gas pressure.

Using such an effect, the stress of the multilayer film 12 or the warping of the substrate 11 can be canceled by the use of the stress of the stress correction film 15. Herein, the stress value and the direction of the stress correction film 15 will be adjusted by controlling the sputter condition (sputter gas pressure, introducing power, film thickness or the like).

In this case, it is preferable that B falls within the range between 10 and 30 at % in the film containing Ta and B. In case of a film containing Ta, B and N, it is desirable that N falls within the range between 5 and 30 at %, and B falls within the range between 10 and 30 at % when the remaining component is defined as 100.

Material containing Si as a major component can be used as an example other than the TaB as the stress correction film 15. Specifically, the material may be Si itself or Si doped with additives. Here, N or O is exemplified as the additives. The material containing Si as a major component is preferably in an amorphous state, and desirably has a semiconductor property.

This reason will be explained as follows. It is assumed that the stress correction film is deposited between the substrate and the multilayer film or on the back surface (such a surface that the multilayer film is not deposited).

In this case, if the stress correction film 15 made of conductive material is formed on the back surface, a chuck property is improved when the back surface of the substrate 11 must be chucked by an electrostatic chuck during dealing with the EUV mask blank or the EUC mask.

Although the TaB film and the Si based film are exemplified as the stress correction film 15, it is not restricted to them. If it is a film which is smooth and is capable of readily controlling the stress, TaGe, TaGeN, TaSi, TaSiN, WN, CrN or the like can be used.

(3) Deposition step of the multilayer film onto the substrate:

The multilayer film made of Mo and Si is used as the multilayer film 12 in many cases. Alternatively, use can be made of Ru/Si, Mo/Be, Mo compound/Si compound, a Si/Nb period multilayer film, a Si/Mo/Ru period multilayer film, a Si/Mo/Ru/Mo period multilayer film and a Si/Ru/Mo/Ru period multilayer film as material with high reflectivity in a specific wavelength region. Herein, a suitable film thickness will be different in accordance with material.

In the case of the multilayer film made of Mo and Si, a Si film is initially deposited under Ar gas atmosphere using a Si target by the use of the DC magnetron sputter method. Thereafter, a Mo film is deposited under Ar gas atmosphere using a Mo target. By using this process as one period, the lamination is carried out with 30~60 periods, preferably 40 period. Finally, the Si film is deposited. For example, the stress of the multilayer film 12 was −500 MPa in a 0.2 $\mu$m thickness. Through such a step, the substrate with the multilayer film can be obtained.

(4) Deposition step of the etching stopper:

$SiO_2$ is used as the material of the etching stopper film 13 in many cases. However, $Al_2O_3$, CrN or the like may be used as material with high resistance to etching in accordance with such a condition for etching the absorber layer 13.

In the case where $SiO_2$ is used, it is preferable that a $SiO_2$ film is deposited on the substrate with multilayer film under Ar gas atmosphere using a $SiO_2$ target by the use of a RF magnetron sputter method.

(5) Deposition step of the EUV absorber layer:

The material of the EUV absorber layer 13 preferably comprises material containing Ta as a major component, material containing Ta as a major component and at least B, material of an amorphous structure containing Ta as a major component, material of an amorphous structure containing Ta as a major component and at least B (for example, material of the amorphous structure containing B represented by $Ta_4B$ with about 25%), material containing Ta, B and N (for example, material of the amorphous structure containing Ta as a major component, B with about 15%, and N with about 10%), and material containing Cr as a major component and at least one component selected from the group consisting of N, O, and C (for example, CrN, and material added with O, C into CrN).

However, the material of the EUV absorber layer 13 is not restricted to such materials, and alternatively, TaSi, TaSiN, TaGe, TaGeN, WN, Cr, TiN or the like can be used.

In the case that a TaB compound thin-film is used as the material of the EUV absorber layer 14, it is preferable that a $Ta_4B$ film is deposited under Ar gas atmosphere using a $Ta_4B$ target by the use of the DC magnetron sputter method.

In this event, it is desirable that the stress of the EUV absorber layer 13 is set to 50 MPa or less by optimizing the sputter condition (gas pressure, DC power or the like). Through such a step, the EUV mask blank can be obtained.

Meanwhile, the EUV mask blank of this invention and the EUV mask, which will be described later, have such a feature that the stress correction film is formed so as to correct the warping of the substrate with the multilayer film, as discussed above.

Here, the warping of the surface of the multilayer film is mainly caused by the warping of the substrate itself and the warping generated by the stress of the multilayer film deposited on the substrate. However, in the case where a protection layer or an etching stopper layer is additionally formed as an intermediate layer, the stress and the film thickness of the stress correction film will be determined such that desired flatness can be finally obtained by taking the stress of the intermediate layer into consideration.

(6) EB resist application step:

The EUV mask can be manufactured by forming the pattern on the absorber layer of the thus-obtained EUV mask blank. The EB resist is applied on the EUV mask blank obtained in the step (5), and is baked at 200° C.

(7) The EB resist writing step:

The resist pattern is formed on the EUV mask blank applied with the EB resist by the use of an EB writing machine of 30 KeV.

(8) Dry-etching step:

The EUV absorber layer 14 is dry-etched with chlorine at substrate temperature of 20° C. by using the above resist pattern as the mask by the use of an ICP-RIE apparatus to thereby pattern the absorber layer. Under this condition, the $SiO_2$ serving as a base layer is removed by the use of dilute hydrofluoric acid solution. Further, the resist, which remains on the absorber layer pattern, is removed by the use of hot strong sulfuric acid at 100° C. Through such a step, the EUV mask can be obtained.

Meanwhile, the pattern for the absorber layer is formed by using the etching method. However, the pattern forming method is not restricted to such a method, and for example, a lift-off method or the like can be used alternatively.

(9) Pattern transfer onto the semiconductor substrate due to the EUV mask:

The EUV light ray (soft X-ray) given from a laser plasma X-ray source 41 is entered to the aforementioned EUV mask 42, and the reflected light ray is transferred onto a Si wafer substrate 44 via a shrinkage optical system 43, as illustrated in FIG. 6. In this event, an X-ray reflection mirror can be used as a shrinkage optical system 43.

The pattern reflected by the EUV mask 42 via the shrinkage optical system is generally shrinked to ¼. For example, the transfer of the pattern onto the Si wafer substrate 44 can be performed by exposing the pattern on the resist layer formed on the Si substrate 44 and developing the pattern.

In the case where wavelength band of 13–14 nm is used as the exposure wavelength, the transfer is generally carried out such that an optical path is positioned in vacuum. A Mo/Si multilayer film having peak wavelength in such wavelength band will be used as material of the multilayer film in wavelength band of 13–14 nm.

For example, the pattern is formed on the Si wafer substrate by using the EUV mask obtained by the first embodiment, thus being capable of producing a semiconductor device such as a LSI with high integration.

(Second Embodiment)

Subsequently, explanation will be made about the production of the EUV mask and the pattern transfer onto the semiconductor substrate due to the aforementioned EUV mask according to a second embodiment with reference to FIGS. 5 and 6.

The production of the EUV mask and the pattern transfer onto the semiconductor substrate comprises the steps of (1) the preparation step of the substrate, (2) the deposition step of the stress compression film onto the substrate back surface (such a side that the multilayer film is not deposited), (3) the deposition step of the multilayer film onto the substrate, (4) the deposition step of the etching stopper, (5) the deposition step of the EUV absorber layer, (6) the application step of the EB resist, (7) the EB writing step, (8) the dry-etching step, and (9) the pattern transfer onto the semiconductor substrate due to the EUV mask.

The second embodiment is different from the first embodiment in (2) the deposition step of the stress compression film onto the substrate back surface (such a side that the multilayer film is not deposited). Accordingly, this step will be mainly explained thereinafter.

(2) Deposition step of the stress correction film onto the substrate back surface:

The multilayer film 12 generally has the compression stress. Therefore, if the substrate 11, which substantially has no warping, is used during depositing the stress correction film 16 on the back surface of the substrate 11, the stress correction film 16 to be deposited will have such stress and film thickness that the warping generated by the stress of the multilayer film 12 can be canceled. Although the material thereof is not restricted particularly, the semiconductor film with conductivity or the metal film is preferable because handling can be effectively carried out during using the electrostatic chuck.

Here, such force that the film gives for the warping of the substrate generally is represented by integration between the stress of the film material and the film thickness.

Consequently, the material, the deposition method and the film thickness of the stress correction film 16 will be determined by the stress of the stress correction film material 16 such that the integration of the film thickness cancels the total of the warping the substrate 11 and the warping the multilayer film 12.

For example, in the case where the stress correction film 16 has the film thickness of 0.28 $\mu$m and the stress of −500 MPa, if the film is thinned to half (0.14 $\mu$m), the material will be selected such that the stress becomes twice (−1000 MPa).

If the substrate 11 itself substantially has no warping, the thickness of the multilayer film 12 will have the same value as the thickness of the stress correction film 16. Thereby, the deposition is simply carried out such that the stress with the same force as the multilayer film 12 gives for the stress correction film 16.

When the TaB film is deposited on the back surface (such a side that the multilayer is not deposited) of the substrate 11 as the stress correction film 16, it is desirable that the deposition is performed at the room temperature under the Ar gas atmosphere by the use of the DC magnetron sputter method.

Under this circumstance, the sputter condition is controlled such that the film thickness of the stress correction film 16 has the same film thickness as the multilayer film 12 to be deposited and the stress becomes the same degree as the stress of the multilayer film 12 in order to cancel with the stress of the multilayer film 12.

In this condition, the stress can be readily varied by controlling gas pressure and DC power as the sputter condition in the TaB film, as discussed above. Consequently, the stress can be arbitrarily controlled from the tensile stress to the compression stress by controlling the gas pressure and the DC power.

The substrate with the multilayer film, the EUV mask blank, and the EUV mask having the similar characteristic with the first embodiment can be obtained according to the second embodiment.

For example, the pattern is formed on the Si wafer substrate by using the EUV mask obtained by the second embodiment, thus being capable of producing the semiconductor device such as the LSI with high integration.

Meanwhile, although the deposition of the stress correction film 16 onto the back surface of the substrate 11 is carried out before the deposition step of the multilayer film 12 according to this embodiment, the deposition is not restricted to this process, and it may be performed between the respective steps after depositing the multilayer film 12. For example, the deposition may be carried out after depositing the multilayer film 12, or after depositing the absorber layer 14, or after forming the pattern for the absorber layer 14.

(Application for the reflection mirror for EUV with the multilayer film):

The substrate with the multilayer film according to this invention is applicable for the EUV mask, the EUV mask blank, and the reflection mirror for EUV or the like. However, a curve surface is often required as a reflection surface of a light ray in the reflection mirror for EUV. Therefor, in the case that the substrate with the multilayer film according to this invention is employed, the force and the direction of the stress correction film will be adjusted, and will be corrected such that the warping of the reflection surface corresponds to a desired curvature.

EXAMPLES

First Example

Referring to FIG. 4, description will be made about a first example of this invention.

A $SiO_2$—$TiO_2$ based glass substrate with low expansion having an outer diameter of 6-inch square and a thickness of 6.3 mm was used as a glass substrate 11. Further, the glass substrate 11 had a smooth surface of 0.2 nmRms or less and flatness of a hollow surface of 90 nm by mechanically polishing.

The TaB film (Ta: B=75:15(at %)) was deposited on the surface of the glass substrate 11 as the stress correction film 15. The TaB film was formed to a thickness of 0.28 μm at the room temperature under Ar gas pressure of 0.6 Pa by the use of the DC magnetron sputter method.

As a result, the stress correction film 15 had the tensile stress opposite to the multilayer film 12 so as to cancel the stress of the multilayer film 12, and the stress value was +480 MPa with the same degree.

Mo and Si were laminated as the multilayer film 12. A Si film was initially deposited to 4.2 nm under Ar gas of 0.1 Pa using a Si target by the use of the DC magnetron sputter method. Thereafter, a Mo film was deposited to 2.8 nm under Ar gas of 0.1 Pa using a Mo target. Using such a process as one period, lamination was performed with 40 periods, and finally, a Si film was deposited to 4 nm. Here, the stress of the multilayer film 12 was −500 MPa. Thus-obtained substrate with the multilayer film had flatness of 40 nm.

Subsequently, the etching stopper 13 made of the $SiO_2$ film was deposited to a thickness of 0.05■ m on the multilayer film 12 by using the $SiO_2$ target and using Ar gas as sputter gas by the use of the RF magnetron sputter method. In this event, the etching stopper 13 had the stress of −50 MPa.

Finally, a film containing Ta and B (Ta:B=75:15 (at %)) was deposited to a thickness of 0.1■ m on the etching stopper 13 made of the $SiO_2$ film as the EUV absorber layer 14 by the use of the DC magnetron sputter method. In this condition, the stress of the EUV absorber layer 14 was set to +50 MPa by controlling the sputter condition. As a result, the EUV mask blank with flatness of 50 nm on the surface of the multilayer film could be obtained.

Next, the EUV mask with a pattern for a 16 Gbit-DRAM having a design rule of 0.07■ m was manufactured by using the EUV mask blank by using the following method.

Initially, an EB resist was coated on the aforementioned EUV mask blank, and a resist pattern was formed by EB writing. The TaB absorber layer 13 was dry-etched with chlorine by using the resist pattern as the mask, and the absorption pattern was formed on the EUV mask blank.

The etching stopper 13 made of the $SiO_2$ as the base layer was removed with dilute hydrofluoric acid solution, and the resist remained on the absorption pattern was removed, thus manufacturing the EUV mask.

The flatness of the surface of the multilayer film was measured by an interferometer with respect to the EUV mask manufactured by the above method. As a result, it was confirmed that the surface had high flatness of 50 nm. Further, the exposure transfer was carried out for EUVL. In consequence, it was found out that it had EUV reflection characteristic with enough high accuracy.

Second Example

Referring to FIG. 5, description will be made about a second example of this invention.

The glass substrate having flatness similar with the first example was used as the substrate 11. The TaB film was deposited on the back surface (such a side that the multilayer film was not deposited) of the glass substrate 11 as the stress correction film 16. The TaB film was deposited to a thickness of 0.28■ m at the room temperature under Ar gas pressure of 0.2 Pa by the use of the DC magnetron sputter method.

Under such a circumstance, the film thickness of the stress correction film 16 was set to 0.28■ m, which is the same as the multilayer film 12 to be deposited, and the stress was set to −500 MPa with the same direction and force so as to cancel with the stress of the multilayer film 12. Thus-obtained substrate with the multilayer film had flatness of 90 nm.

The multilayer film 12 was deposited on the surface of the glass substrate 11 like the first example, and the etching stopper 13 made of the $SiO_2$ film similar with the first embodiment was deposited on the multilayer film 12. The EUV absorber layer 14 containing Ta and B similar with the first example was deposited on the $SiO_2$ film. As a result, EUV mask with the flatness of 100 nm on the surface of the multilayer film could be obtained.

The EUV mask was manufactured by using such an EUV mask blank like the first example.

The flatness of the surface of the multilayer film was measured by an interferometer with respect to the EUV mask manufactured by the above method. As a result, it was confirmed that the surface had high flatness of 100 nm. Further, the exposure transfer was carried out for EUVL. In consequence, it was found out that it had EUV reflection characteristic with enough high accuracy.

Third Example

Referring to FIG. 5, description will be made about a third example of this invention.

The glass substrate similar with the first example was used as the substrate 11. Here, the glass substrate had flatness of a smooth surface of 0.2 nm or less and a convex surface of 500 nm by polishing mechanically.

The TaB film was deposited on the back surface (such a side that the multilayer film was not deposited) of the glass substrate 11 as the stress correction film 16. The TaB film (Ta:B=75:15 (at %)) was deposited to a thickness of 0.3■ m at the room temperature under Ar gas pressure of 0.15 Pa by the use of the DC magnetron sputter method.

The film thickness of the stress correction film 16 was such a value that −700 MPa could be obtained so as to eliminate both the warping (deformation) of the glass substrate 11 and the stress of the multilayer film 12.

The multilayer film 12 was deposited on the surface of the glass substrate 11 like the first example. Herein, the stress of the multilayer film 12 was −500 MPa. Thus-obtained substrate with the multilayer film has flatness of 50 nm.

Subsequently, the etching stopper 13 made of the $SiO_2$ film similar with the first example was deposited on the multilayer film 12. Finally, the EUV absorber layer 14 containing Ta and B similar with the first example was deposited on the etching stopper 13 made of the $SiO_2$ film. As a result, the EUV mask blank with such characteristic that the flatness is 60 nm on the surface of the multilayer film could be obtained.

The EUV mask was manufactured by using such an EUV mask blank like the first example.

The flatness of the surface of the multilayer film was measured by an interferometer with respect to the EUV mask manufactured by the above method. As a result, it was confirmed that the surface had high flatness of 60 nm. Further, the exposure transfer was carried out for EUVL. In consequence, it was found out that it had EUV reflection characteristic with enough high accuracy.

As discussed above, as apparent from the results described in the first to third examples, the flatness of the surface of the multilayer is set to 100 nm or less with respect to the substrate with multilayer film according to this invention.

Consequently, it is possible to transfer the pattern with high accuracy and low image placement error during transferring the pattern by using the EUV mask produced by the examples.

Further, the stress of the multilayer film and the warping the surface of the multilayer formed by the warping the substrate itself can be corrected by depositing the stress correction film according to this invention.

In consequence, the substrate with multilayer film having the surface of the multilayer film with high flatness, the EUV mask blank, the EUV mask, and the multilayer film mirror with a desired curvature can be obtained.

Although description has been made about the mask blank for the EUV light ray, the mask, and substrate with multilayer film, the reflection type mask blank for exposure, the reflection type mask for exposure, and the substrate with multilayer film according to this invention are not restricted to the use of the EUV light ray, and are applicable for a mask for the other wavelength region, a mask blank, and a mirror or the like.

According to this invention, namely, the stress correction film is deposited so as to correct the warping the surface of the multilayer film formed by the warping of the substrate and the stress of the multilayer film according to this invention.

As a result, the warping of the multilayer film formed by the stress of the multilayer film and the warping of the substrate itself can be corrected, thus realizing the substrate with multilayer film having the surface of the multilayer film with high flatness, the mask blank and the mask or the like.

While this invention has thus far been disclosed in conjunction with several embodiments thereof, it will be readily possible for those skilled in the art to put this invention into practice in various other manners.

What is claimed is:

1. A reflection type mask blank for exposure, comprising:
   a substrate;
   a multilayer film which is formed on the substrate so as to reflect a light ray;
   a light absorber layer which is formed on the multilayer film so as to absorb the light ray, and
   a stress correction film which corrects warping of a surface of the multilayer film and which is placed between the substrate and the multilayer film or on a back surface of the substrate, the warping being formed by warping of the substrate and stress of the multilayer film;
   wherein the stress correction film is made of material containing Ta as a major component and at least B,
   the multilayer film has flatness with respect to a surface thereof, and the flatness is 100 nm or less.

2. A reflection type mask blank for exposure, comprising:
   a substrate;
   a multilayer film which is formed on the substrate so as to reflect a light ray; and
   a light absorber layer which is formed on the multilayer film so as to absorb the light ray; and
   a stress correction film which corrects warping of a surface of the multilayer film and which is placed between the substrate and the multilayer film or on a back surface of the substrate, the warping being formed by warping of the substrate and stress of the multilayer film;
   wherein the stress correction film is made of material containing Cr and N, N having a ratio between 5 and 35 at %,
   the multilayer film has flatness with respect to a surface thereof, and
   the flatness is 100 nm or less.

3. A mask blank as claimed in claim 1 or 2, wherein:
   the light ray is an EUV light ray, and
   the reflection type mask bland for exposure is a reflection type mask blank for EUV exposure.

4. A reflection type mask for exposure, wherein:
   a pattern of the light absorber layer is formed by patterning the light absorber layer using the reflection type mask blank for exposure claimed in claim 1 or 2.

5. A method for manufacturing a semiconductor device, wherein:
   a pattern is formed on the substrate by using the reflection the mask for exposure claimed in claim 4.

6. A method for manufacturing a reflection type mask for exposure produced by using the reflection type mask for exposure blank claimed in claim 1 or 2.

7. A substrate, comprising:
   a multilayer film for reflecting a light ray onto the substrate; and
   a stress correction film which corrects warping of a surface of the multilayer film and which is placed between the substrate and the multilayer film or on a back surface of the substrate, the warping being formed by warping of the substrate and stress of the multilayer film;

wherein the stress correction film is made of material containing Cr and N, N having a ratio between 5 and 35 at %, the multilayer film has flatness with respect to a surface thereof, and the flatness is 100 nm or less.

8. A method for manufacturing a semiconductor device, wherein:

a pattern is transferred on the substrate by using the reflection type mask for exposure claimed in claim 7.

9. A substrate, comprising:

a multilayer film for reflecting a light ray onto the substrate; and a stress correction film which corrects warping of a surface of the multilayer film and which is laced between the substrate and the multilayer film or on a back surface of the substrate, the warping being formed by warping of the substrate and stress of the multilayer film;

wherein the stress correction film is made of material containing Ta as a major component and at least B, the multilayer film has flatness with respect to a surface thereof, and the flatness is 100 nm or less.

10. A substrate with a multilayer film for reflecting a light ray onto a substrate, wherein:

the multilayer film has flatness with respect to a surface thereof, and the flatness is 100 nm or less.

11. A substrate with a multilayer film for reflecting a light ray onto a substrate, comprising:

a stress correction film which corrects warping of a surface of the multilayer film, the warping being formed by warping of the substrate and stress of the multilayer film.

12. A reflection mirror produced by using the substrate with the multilayer film as claimed in claim 10 or 11.

13. A reflection type mask blank for exposure, comprising:

a substrate;

a multilayer film which is formed on the substrate so as to reflect a light ray; and a light absorber layer which is formed on the multilayer film so as to absorb the light ray;

wherein the multilayer film has flatness with respect to a surface thereof, and the flatness is 100 nm or less.

14. A reflection type mask blank for exposure, comprising:

a substrate;

a multilayer film which is formed on the substrate so as to reflect a light ray;

a light absorber layer which is formed on the multilayer film so as to absorb the light ray; and a stress correction film which corrects warping generated on a surface of the multilayer film when the stress correction film is not formed.

15. A reflection type mask for exposure produced by using the reflection type mask blank for exposure claimed in claim 13 or 14.

* * * * *